United States Patent
Bae et al.

(10) Patent No.: US 11,232,986 B2
(45) Date of Patent: Jan. 25, 2022

(54) INTEGRATED CIRCUIT DEVICES INCLUDING ENLARGED VIA AND FULLY ALIGNED METAL WIRE AND METHODS OF FORMING THE SAME

(71) Applicant: Samsung Electronics Co., Ltd., Suwon-si (KR)

(72) Inventors: Tae Yong Bae, Seoul (KR); Hoon Seok Seo, Suwon-si (KR); Ki Hyun Park, Yongin-si (KR); Hak-Sun Lee, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/785,732

(22) Filed: Feb. 10, 2020

(65) Prior Publication Data

US 2021/0111070 A1 Apr. 15, 2021

Related U.S. Application Data

(60) Provisional application No. 62/913,865, filed on Oct. 11, 2019.

(51) Int. Cl.
*H01L 21/768* (2006.01)

(52) U.S. Cl.
CPC .. *H01L 21/76895* (2013.01); *H01L 21/76802* (2013.01); *H01L 21/76843* (2013.01); *H01L 21/76877* (2013.01); *H01L 21/76885* (2013.01)

(58) Field of Classification Search
CPC ......... H01L 21/76895; H01L 21/76885; H01L 21/76802; H01L 21/76877; H01L 21/76843
See application file for complete search history.

(56) References Cited

U.S. PATENT DOCUMENTS 6,309,957 B1 * 10/2001 Tu ............... H01L 21/76802
257/E21.577
8,399,352 B2 3/2013 Werner et al.
(Continued)

FOREIGN PATENT DOCUMENTS

KR 19990060812 7/1999
KR 20010008605 2/2001

OTHER PUBLICATIONS

Bobb-Semple et al. "Area-Selective Atomic Layer Deposition Assisted by Self-Assembled Monolayers: A Comparison of Cu, Co, W, and Ru" Chemistry of Materials, 31(5):1635-1645 (2019).
(Continued)

*Primary Examiner* — Karen Kusumakar
(74) *Attorney, Agent, or Firm* — Myers Bigel, P.A.

(57) ABSTRACT

Integrated circuit devices and methods of forming the same are provided. The methods of forming an integrated circuit device may include forming a first insulating layer and a via contact on a substrate. The substrate may include an upper surface facing the via contact, and the via contact may be in the first insulating layer and may include a lower surface facing the substrate and an upper surface opposite to the lower surface. The methods may also include forming a second insulating layer and a metallic wire on the via contact. The metallic wire may be in the second insulating layer and may include a lower surface that faces the substrate and contacts the upper surface of the via contact. Both the lower surface of the metallic wire and an interface between the metallic wire and the via contact may have a first width in a horizontal direction that is parallel to the upper surface of the substrate.

18 Claims, 16 Drawing Sheets

(56) References Cited

U.S. PATENT DOCUMENTS

| | | |
|---|---|---|
| 8,796,859 B2 | 8/2014 | Kim |
| 9,040,414 B2 | 5/2015 | Lee |
| 9,391,019 B2 | 7/2016 | Kobrinsky et al. |
| 9,437,540 B2 | 9/2016 | Lin et al. |
| 9,966,337 B1 * | 5/2018 | Briggs .............. H01L 21/76834 |
| 10,090,247 B1 * | 10/2018 | Briggs .............. H01L 21/76804 |
| 10,354,912 B2 | 7/2019 | Xu et al. |
| 2007/0145591 A1 * | 6/2007 | Yano ................. H01L 21/76814 |
| | | 257/758 |
| 2019/0096751 A1 * | 3/2019 | Sato ................. H01L 21/76808 |

OTHER PUBLICATIONS

Mackus et al. "From the Bottom-Up: Toward Area-Selective Atomic Layer Deposition with High Selectivity" Chemistry of Materials, 31(1):2-12 (2019).

* cited by examiner

_US 11,232,986 B2_

INTEGRATED CIRCUIT DEVICES INCLUDING ENLARGED VIA AND FULLY ALIGNED METAL WIRE AND METHODS OF FORMING THE SAME

CROSS-REFERENCE TO RELATED APPLICATION

This application claims priority to U.S. Provisional Application Ser. No. 62/913,865, entitled METHODS OF FABRICATING FULLY ALIGNED METAL ON VIA, filed in the USPTO on Oct. 11, 2019, the disclosure of which is hereby incorporated by reference herein in its entirety.

FIELD

The present disclosure generally relates to the field of electronics and, more particularly, to integrated circuit devices.

BACKGROUND

A fully-aligned metal wire structure has been introduced to provide stable electrical connection between a via contact and a metal wire subsequently formed on the via contact. A fully-aligned metal wire structure, however, may not provide uniform surface resistance between a via contact and a metal wire because of an overlay error while forming the metal wire.

SUMMARY

According to some embodiments of the present inventive concept, methods of forming an integrated circuit device may include sequentially forming a via contact and a metal wire through separate processes. The via contact may be an enlarged via contact that has a width wider than a width of the metal wire. A difference between the width of the via contact and the width of the metal wire may be greater than an overlay margin between the via contact and the metal wire such that the metal wire may include a portion that overlaps and entirely contacts the underlying via contact even if there is an overlay error while forming the metal wire. Further, the methods may include forming a fully-aligned metal wire by forming a recess above the via contact before forming the metal wire.

According to some embodiments of the present inventive concept, methods of forming an integrated circuit device may include forming a first insulating layer and a via contact on a substrate. The substrate may include an upper surface facing the via contact, and the via contact may be in the first insulating layer and may include a lower surface facing the substrate and an upper surface opposite to the lower surface. The methods may also include forming a second insulating layer and a metallic wire on the via contact. The metallic wire may be in the second insulating layer and may include a lower surface that faces the substrate and contacts the upper surface of the via contact. Both the lower surface of the metallic wire and an interface between the metallic wire and the via contact may have a first width in a horizontal direction that is parallel to the upper surface of the substrate.

According to some embodiments of the present inventive concept, methods of forming an integrated circuit device may include forming a first insulating layer and a via contact on a substrate. The substrate may include an upper surface facing the via contact, and the via contact may include a lower surface facing the substrate and an upper surface that is opposite to the lower surface and may be recessed toward the substrate with respect to the first insulating layer. The methods may also include forming a second insulating layer and a metallic wire on the via contact. The metallic wire may be in the second insulating layer and may contact a portion of the upper surface of the via contact. The via contact may include opposing sides that are spaced apart from each other in a horizontal direction that is parallel to the upper surface of the substrate, and the metallic wire may not overlap the opposing sides of the via contact.

According to some embodiments of the present inventive concept, methods of forming an integrated circuit device may include forming a first insulating layer and a via contact on a substrate. The via contact may be in the first insulating layer, and the substrate may include an upper surface facing the via contact. The methods may also include forming a first metallic wire and a second metallic wire on the via contact and the first insulating layer. The first metallic wire and the second metallic wire may be spaced apart from each other in a horizontal direction that is parallel to the upper surface of the substrate. The first metallic wire is spaced apart from the upper surface of the substrate by a first distance and may contact the via contact, and the second metallic wire is spaced apart from the upper surface of the substrate by a second distance that may be greater than the first distance and may contact the first insulating layer. The first metallic wire may include first opposing sides spaced apart from each other in the horizontal direction, the via contact may include second opposing sides spaced apart from each other in the horizontal direction, and the first opposing sides may be between the second opposing sides.

DETAILED DESCRIPTION

Figure 1:
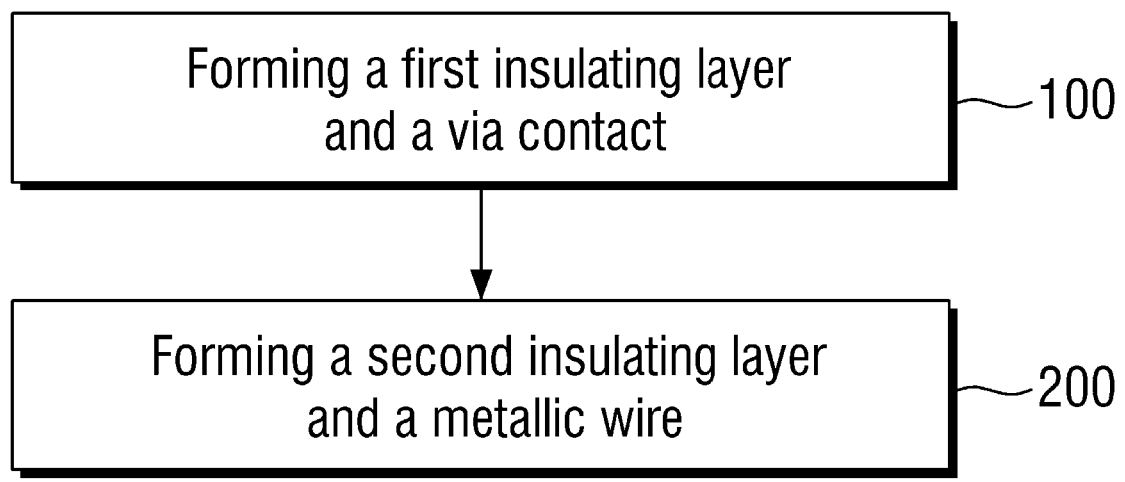
FIG. 1 is a flow chart of a method of forming an integrated circuit device according to some embodiments of the inventive concept.
Figure 2:
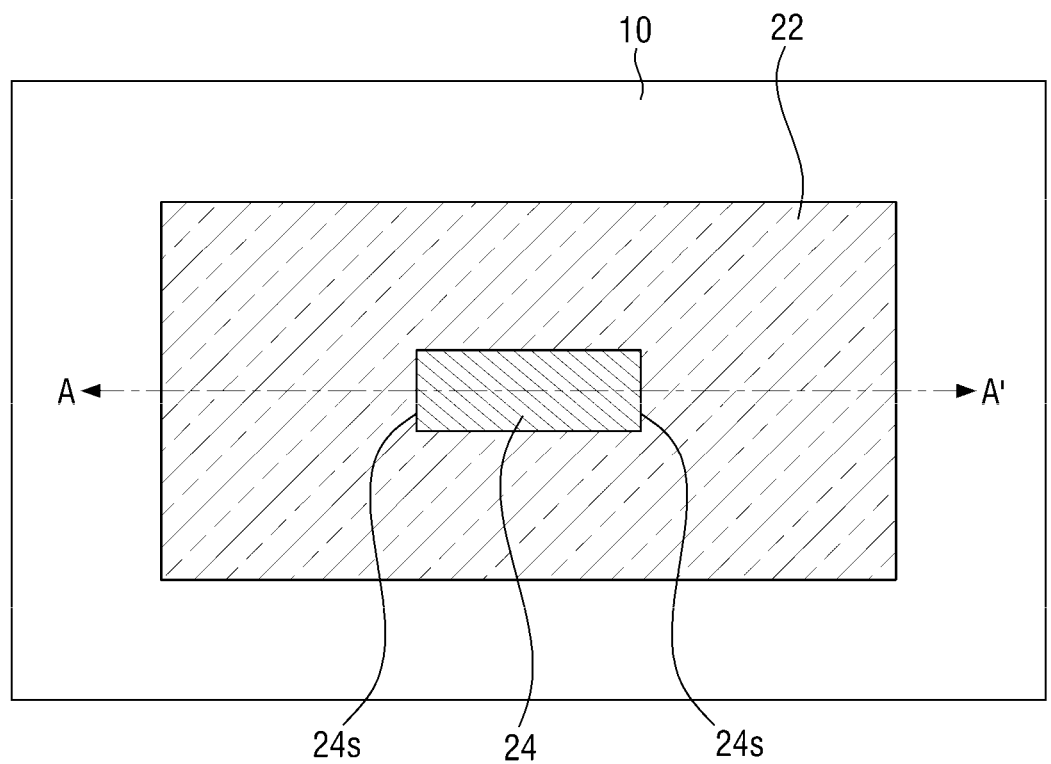
FIGS. 2 and 4 are plan views illustrating a method of forming an integrated circuit device according to some embodiments of the inventive concept.
Figure 2:
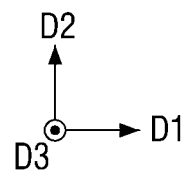
Figure 3:
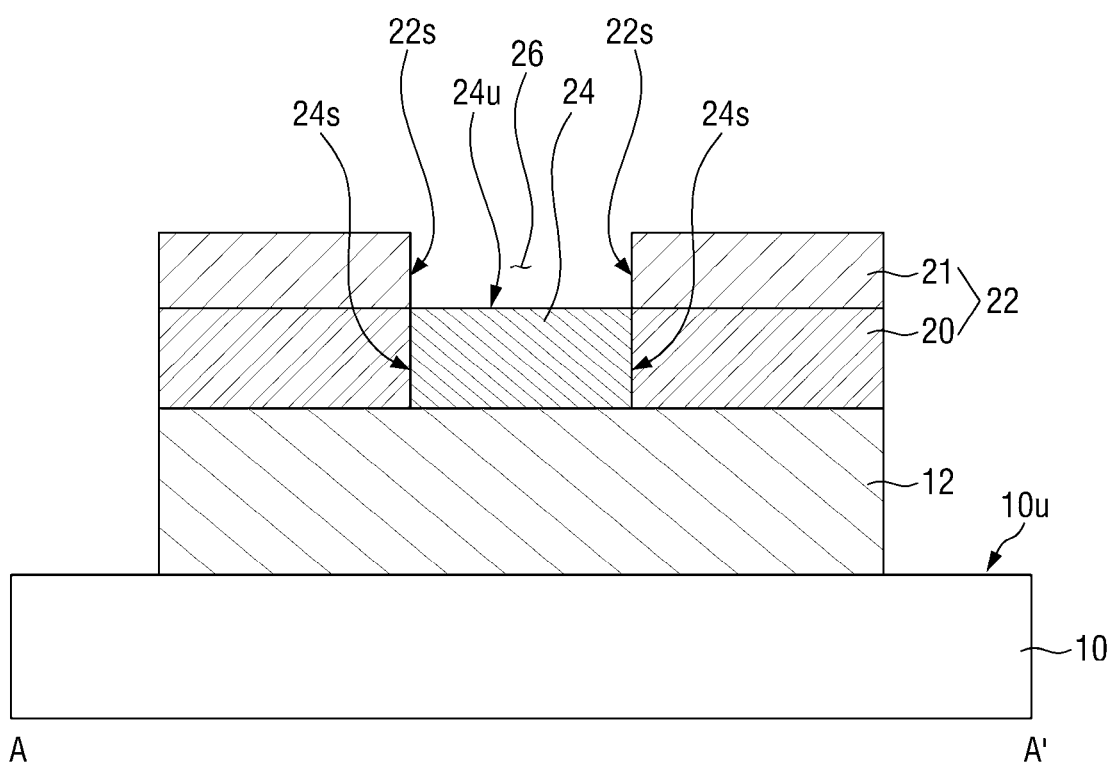
FIGS. 3 and 5 are cross-sectional views taken along the line A-A' of FIGS. 2 and 4, respectively.
Figure 3:
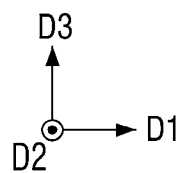
Figure 4:
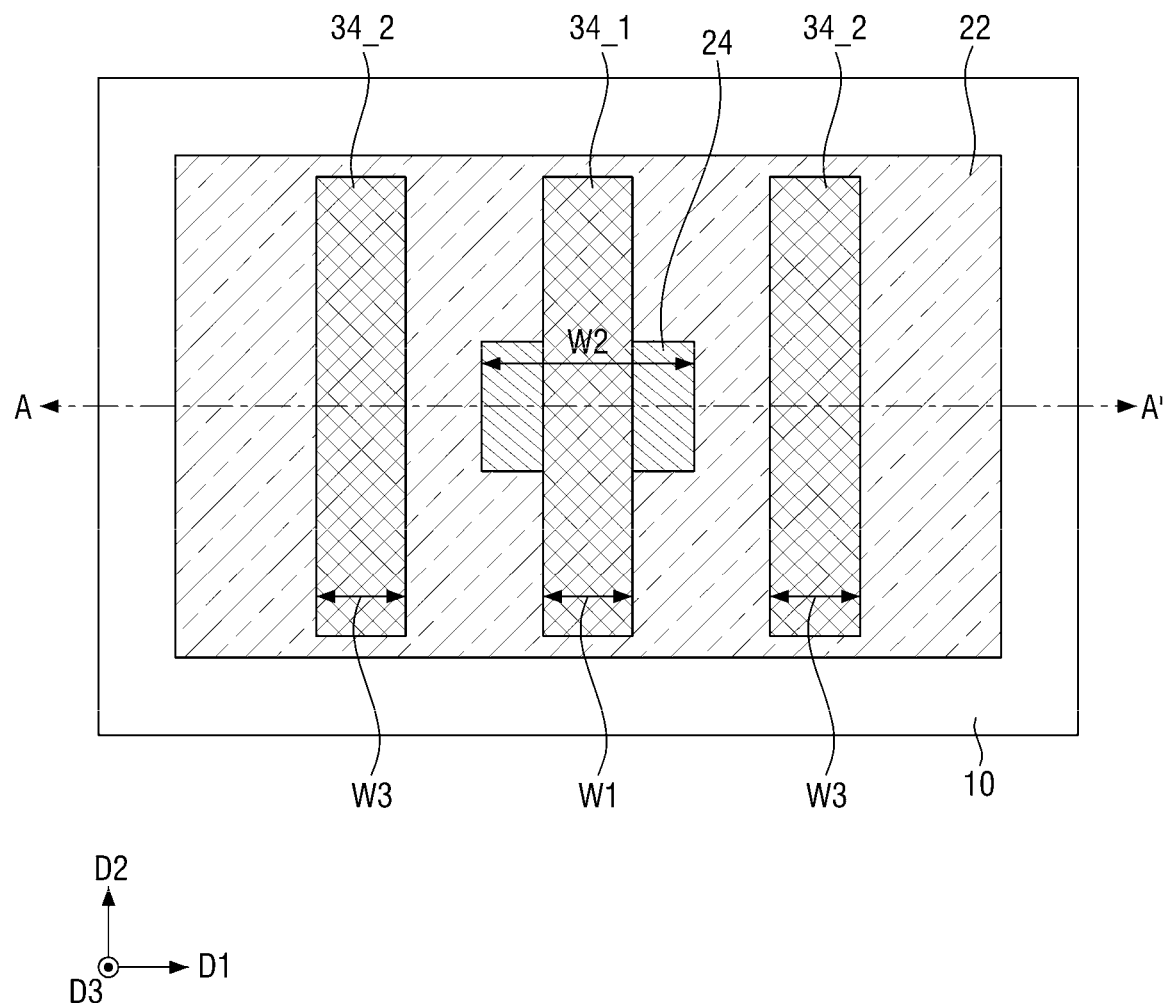
Figure 5:
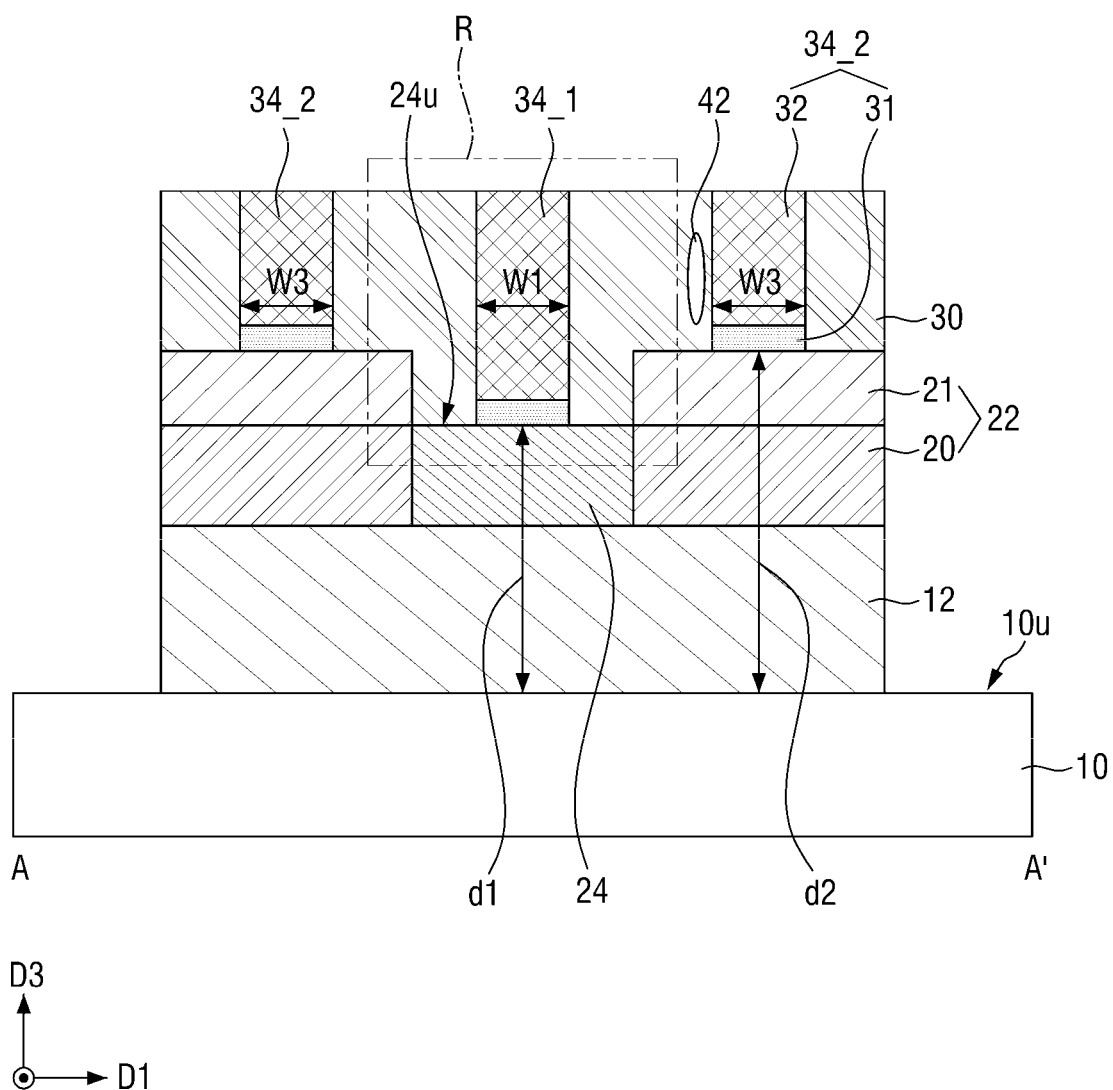
Figure 5A:
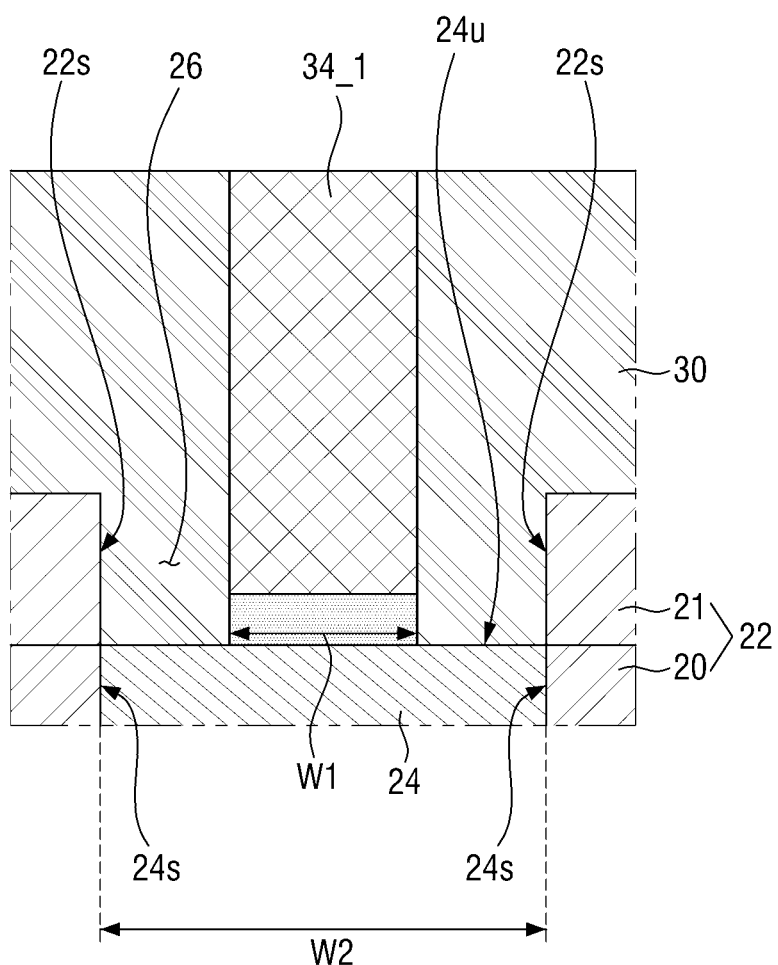
FIG. 5A is an enlarged view of the region R of FIG. 5.

FIG. 1 is a flow chart of a method of forming an integrated circuit device according to some embodiments of the inventive concept. FIGS. 2 and 4 are plan views illustrating a method of forming an integrated circuit device according to some embodiments of the inventive concept, and FIGS. 3 and 5 are cross-sectional views taken along the line A-A' of FIGS. 2 and 4, respectively. FIG. 5A is an enlarged view of the region R of FIG. 5.

Referring to FIGS. 1 through 3, a method may include forming a first insulating layer 22 and a via contact 24 on a substrate 10 (Block 100). The via contact 24 may be in the first insulating layer 22. In some embodiments, an underlying structure 12 may be formed on the substrate 10 before forming the first insulating layer 22 and the via contact 24. The underlying structure 12 may include various elements of the integrated circuit device (e.g., source/drain regions, capacitors, word lines, and/or bit lines), and the via contact 24 may be electrically connected to one of the elements of the integrated circuit device. The substrate 10 may include an upper surface 10u facing the via contact 24.

The substrate 10 may include one or more semiconductor materials, for example, Si, Ge, SiGe, GaP, GaAs, SiC, SiGeC and/or InP. In some embodiments, the substrate 10 may be a bulk substrate (e.g., a bulk silicon substrate) or a semiconductor on insulator (SOI) substrate.

The via contact 24 may include metal (e.g., Cu, Co, Ru, Mo, Mn, and/or Nb). Although FIG. 3 shows that the via contact 24 is formed of a single layer, the via contact 24 may include multiple layers (e.g., a metal layer, a diffusion barrier layer, and/or an etch stop layer). In some embodiments, the via contact 24 may be enclosed by the first insulating layer 22 in a plan view as illustrated in FIG. 2. The via contact 24 may include opposing sides 24s that are spaced apart from each other in a first horizontal direction D1. The first horizontal direction D1 may be parallel to the upper surface 10u of the substrate 10.

In some embodiments, as illustrated in FIG. 3, the first insulating layer 22 may include a preliminary first insulating layer 20 and a capping insulating layer 21 sequentially formed on the substrate 10. In some embodiments, the capping insulating layer 21 may be omitted. Both of the preliminary first insulating layer 20 and the capping insulating layer 21 may include an insulating material (e.g., $SiO_2$, SiCOH, or SiOC). The first insulating layer 22 may be spaced apart from the substrate 10 in a third direction D3. The third direction D3 may be a vertical direction and may be perpendicular to the first horizontal direction D1.

The via contact 24 may include an upper surface 24u that is recessed toward the substrate 10 with respect to the first insulating layer 22, and a recess 26 may be defined by opposing sides 22s of the first insulating layer 22 and the upper surface 24u of the via contact 24. In some embodiments, the recess 26 may be defined by opposing sides 22s the capping insulating layer 21 and the upper surface 24u of the via contact 24. The first insulating layer 22 may expose the upper surface 24u of the via contact 24.

Referring to FIGS. 1, 4, 5, and 5A, the method may also include forming a second insulating layer 30 and metallic wires 34_1 and 34_2 (Block 200). The metallic wires 34_1 and 34_2 may be in the second insulating layer 30. To show the underlying via contact 24, the second insulating layer 30 is not shown in FIG. 4. Each of the metallic wires 34_1 and 34_2 may extend longitudinally in a second horizontal direction D2 as illustrated in FIG. 4. The second horizontal direction D2 may be parallel to the upper surface 10u of the substrate 10. In some embodiments, the second horizontal direction D2 may be perpendicular to the first horizontal direction D1.

The metallic wires 34_1 and 34_2 may include a first metallic wire 34_1 and second metallic wires 34_2. The first metallic wire 34_1 and the second metallic wires 34_2 are spaced apart from each other in the first horizontal direction D1. The first metallic wire 34_1 may contact the via contact 24, and the second metallic wires 34_2 may contact the first insulating layer 22.

The first metallic wire 34_1 may have a first width w1 in the first horizontal direction D1. Although FIG. 5 shows that the first metallic wire 34_1 has a uniform width (i.e., the first width w1) in the first horizontal direction D1 along the third direction D3, the first metallic wire 34_1 may have a varying width in the first horizontal direction D1 along the third direction D3. In some embodiments, a lower surface of the first metallic wire 34_1 may face the substrate 10 and may contact a portion of the upper surface 24u of the via contact 24. Referring to FIG. 5A, the lower surface of the first metallic wire 34_1 may have the first width w1 in the first horizontal direction D1, and an interface between the first metallic wire 34_1 and the via contact 24 may also have the first width w1 in the first horizontal direction D1.

The upper surface 24u of the via contact 24 may have a second width w2 in the first horizontal direction D1 as illustrated in FIG. 5A. The second width w2 may be wider than the first width w1 of the lower surface of the first metallic wire 34_1. In some embodiments, a difference between the second width w2 and the first width w1 may be equal to or greater than an overlay margin between the via contact 24 and the first metallic wire 34_1 such that an entirety of the lower surface of the first metallic wire 34_1 contacts the via contact 24 even if there is an overlay error while forming the first metallic wire 34_1. For example, the difference between the second width w2 and the first width w1 may be about 6 nanometers (nm) or greater. In some embodiments, the second width w2 may be about 18 nm, and the first width w1 may be about 12 nm. The overlay margin may refer to an alignment margin between two separate elements which are stacked.

Each of the second metallic wires 34_2 may have a third width w3 in the first horizontal direction D1. Although FIGS. 4 and 5 show that the first width w1 and the third width w3 are equal, in some embodiments, the first width w1 may be different from the third width w3.

Referring to FIG. 5A, a lower portion of the first metallic wire 34_1 may be in the recess 26 defined by the opposing sides 22s of the first insulating layer 22 and the upper surface 24u of the via contact 24. In some embodiments, the lower portion of the first metallic wire 34_1 may be spaced apart from the opposing sides 22s of the first insulating layer 22. In some embodiments, the second insulating layer 30 may be formed in the recess 26 and may separate the lower portion of the first metallic wire 34_1 from the opposing sides 22s of the first insulating layer 22.

In some embodiments, the first metallic wire 34_1 may not overlap the opposing sides 24s of the via contact 24 as illustrated in FIG. 5A. In some embodiments, opposing sides of the first metallic wire 34_1, which are spaced apart from each other in the first horizontal direction D1, may be between the opposing sides 24s of the via contact 24 as illustrated in FIG. 5A.

Referring again to FIG. 5, the lower surface of the first metallic wire 34_1 may be spaced apart from the substrate 10 by a first distance d1 in the third direction D3, and the lower surface of one of the second metallic wires 34_2 may be spaced apart from the substrate 10 by a second distance d2 in the third direction D3. The second distance d2 may be longer than the first distance d1. For example, the second distance d2 may be longer than the first distance d1 by about 5 nm or greater. Upper surfaces of the first metallic wire 34_1 and the second metallic wires 34_2 may be coplanar with each other.

Each of the metallic wires 34_1 and 34_2 may include a diffusion barrier layer 31 and a metal layer 32 sequentially stacked on the substrate 10. The diffusion barrier layer 31 may include, for example, metal and/or metal nitride (e.g., Tantalum (Ta), Tantalum Nitride (TaN), Titanium (Ti), and/or Titanium Nitride (TiN)) and may be formed using, for example, a physical vapor deposition (PVD) process, an atomic layer deposition (ALD) process, a chemical vapor deposition (CVD) process, and/or a plating process (e.g., an electricplating process). The metal layer 32 may include metal (e.g., Cu, Co, Ru, Mo, Mn, and/or Nb) and may be formed using, for example, a PVD process, an ALD process, a CVD process, and/or a plating process. In some embodiments, the metal layer 32 may include the same material included in the via contact 24. For example, both the via contact 24 and the metal layer 32 may include Cu.

The second insulating layer 30 may include an insulating material. In some embodiments, the second insulating layer 30 may include an insulating material having a dielectric constant lower than 3.0. In some embodiments, the second insulating layer 30 may be formed using a process that is capable to form the second insulating layer 30 in a narrow space. For example, the second insulating layer 30 may be formed using a flowable CVD process and/or a spin coating process. In some embodiments, the second insulating layer 30 may include a cavity 42 between the first metallic wire 34_1 and one of the second metallic wires 34_2. The cavity 42 may include, for example, air and/or inert gas (e.g., argon gas, nitrogen gas, or helium gas) therein. In some embodiments, the second insulating layer 30 may include a SiCOH layer that may be formed by a Plasma Enhanced Chemical Vapor Deposition (PECVD) process, and the SiCOH layer may have a dielectric constant of about 2.7.

Figure 6:
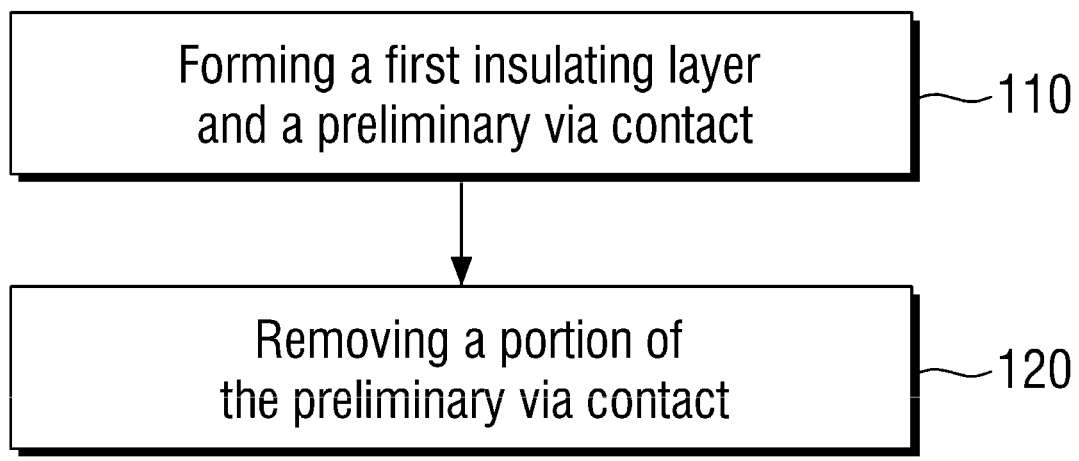
FIG. 6 is a flow chart of a method of forming an integrated circuit device according to some embodiments of the inventive concept.
Figure 7:
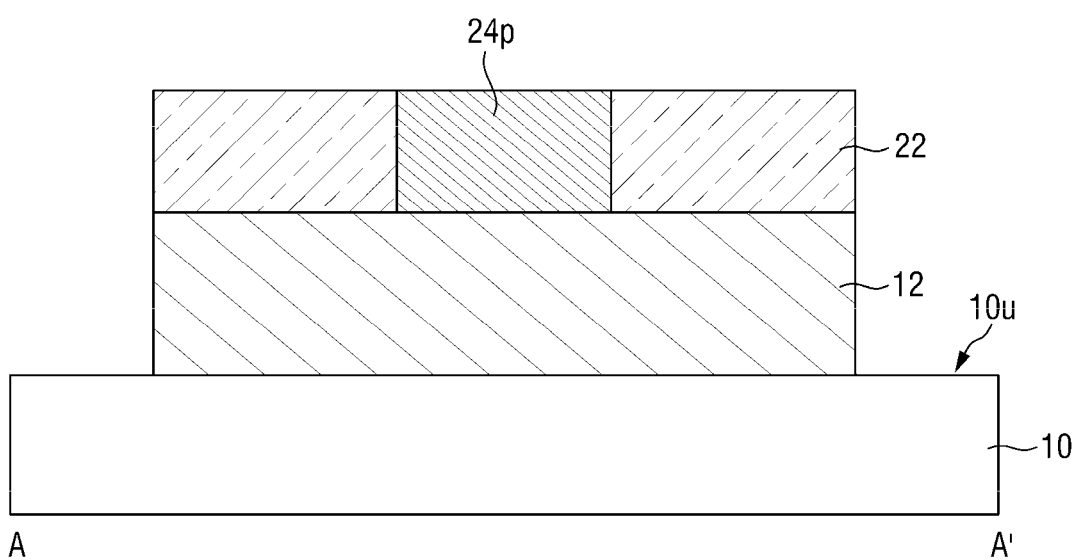
FIGS. 7 and 8 are cross-sectional views illustrating a method of forming an integrated circuit device taken along the line A-A' of FIG. 2.
Figure 7:
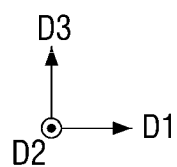
Figure 8:
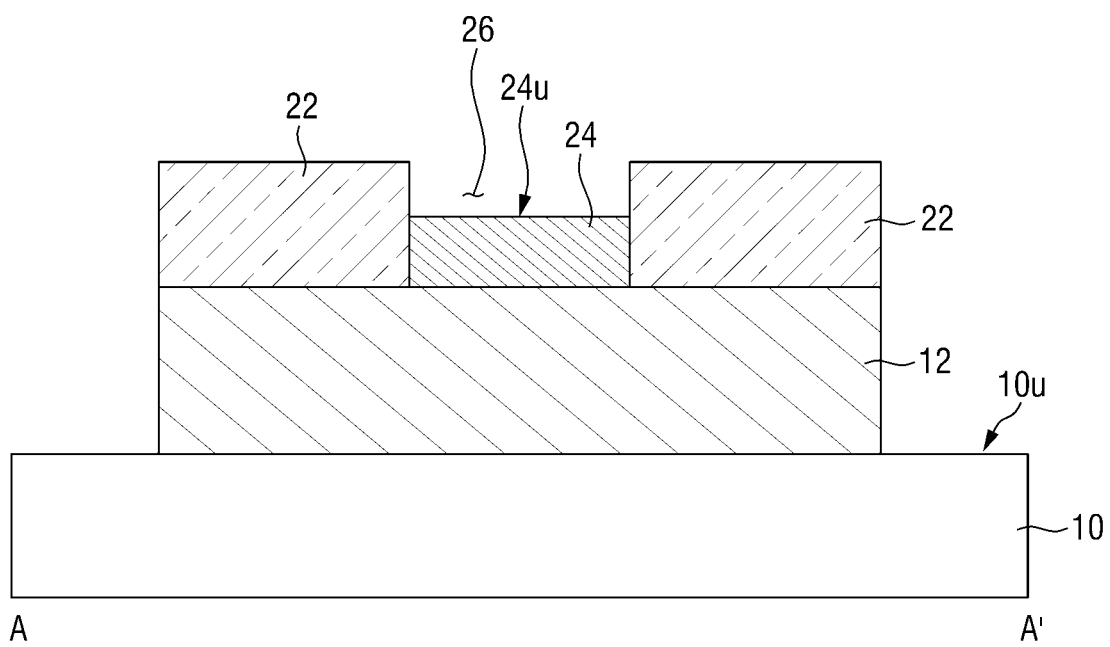

FIG. 6 is a flow chart of a method of forming an integrated circuit device according to some embodiments of the inventive concept, and FIGS. 7 and 8 are cross-sectional views illustrating a method of forming an integrated circuit device taken along the line A-A' of FIG. 2.

Referring to FIG. 1 and FIGS. 6 through 8, in some embodiments, forming a first insulating layer 22 and a via contact 24 on a substrate 10 (Block 100 in FIG. 1) may include forming the first insulating layer 22 and a preliminary via contact 24p on the substrate 10 (Block 110 in FIG. 6) as illustrated in FIG. 7 and removing a portion of the preliminary via contact 24p, thereby forming the via contact 24 in the first insulating layer 22 (Block 120 in FIG. 6) as illustrated in FIG. 8.

Removing the portion of the preliminary via contact 24p may form a recess 26 above an upper surface 24u of the via contact 24. The portion of the preliminary via contact 24p may be removed using various processes, for example, a wet etching process and/or a dry etching process. A depth of the recess in the third direction D3 may be about 5 nm or greater.

Figure 9:
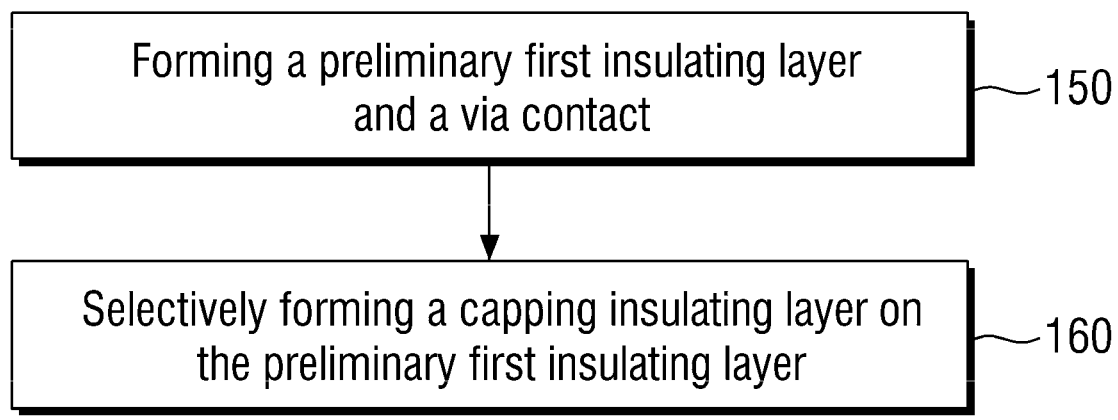
FIG. 9 is a flow chart of a method of forming an integrated circuit device according to some embodiments of the inventive concept.
Figure 10:
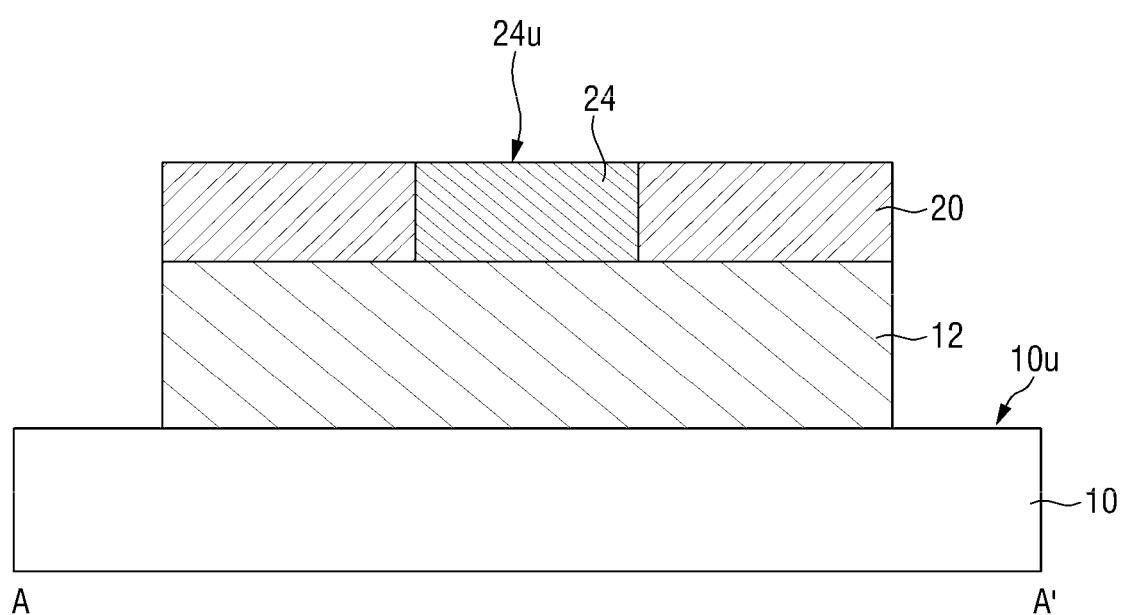
FIG. 10 is a cross-sectional view illustrating a method of forming an integrated circuit device taken along the line A-A' of FIG. 2.
Figure 10:
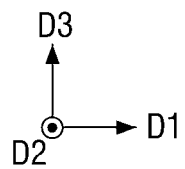

FIG. 9 is a flow chart of a method of forming an integrated circuit device according to some embodiments of the inventive concept, and FIG. 10 is a cross-sectional view illustrating a method of forming an integrated circuit device taken along the line A-A' of FIG. 2.

Referring to FIGS. 1, 3, 9, and 10, in some embodiments, forming a first insulating layer 22 and a via contact 24 on a substrate 10 (Block 100 in FIG. 1) may include forming a preliminary first insulating layer 20 and a via contact 24 (Block 150 in FIG. 9) as illustrated in FIG. 10 and selectively forming a capping insulating layer 21 on the preliminary first insulating layer 20 (Block 160 in FIG. 9) as illustrated in FIG. 3.

Referring to FIG. 10, in some embodiments, the preliminary first insulating layer 20 and the via contact 24 may have upper surfaces coplanar with each other. Referring back to FIG. 3, the capping insulating layer 21 may be selectively formed on the preliminary first insulating layer 20 using, for example, one or more of area-selective atomic layer processes and may not be formed on the via contact 24. A recess 26 may be defined by the capping insulating layer 21 and the upper surface 24u of the via contact 24 as illustrated in FIG. 3 after the capping insulating layer 21 is formed.

In some embodiments, the capping insulating layer 21 may include porous or dense SiCOH, ultra-low k (ULK) material having a dielectric constant lower than 2.5, extreme-low k (ELK) material having a dielectric constant lower than 2.1, SiCN, SiCON, SiO$_2$, SiN, SiON, AlO, AlN, AlON, HfO, HfN, and/or ZrO. In some embodiments, the capping insulating layer 21 may include porous low k material. The low k material has a dielectric constant lower than silicon dioxide. For example, the capping insulating layer 21 may be formed by a process described in Mackus et al. (*From the Bottom-Up: Toward Area-Selective Atomic Layer Deposition with High Selectivity*. Chem. Mater. 2019, 31, 2-12) or Bobb-Semple et al. (*Area-Selective Atomic Layer Deposition Assisted by Self-Assembled Monolayers: A Comparison of Cu, Co, W, and Ru*. Chem. Mater. 2019, 31, 1635-1645). In some embodiments, the preliminary first insulating layer 20 and the capping insulating layer 21 may include different materials. For example, the preliminary first insulating layer 20 may include a SiO$_2$ layer, and the capping insulating layer 21 may include a SiCOH layer.

Figure 11:
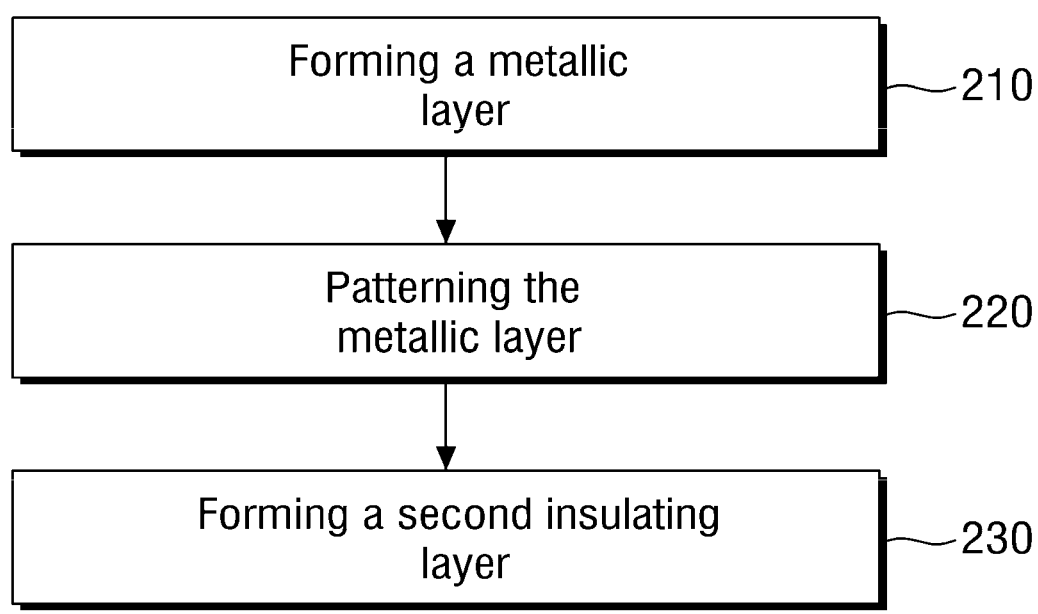
FIG. 11 is a flow chart of a method of forming an integrated circuit device according to some embodiments of the inventive concept.
Figure 12:
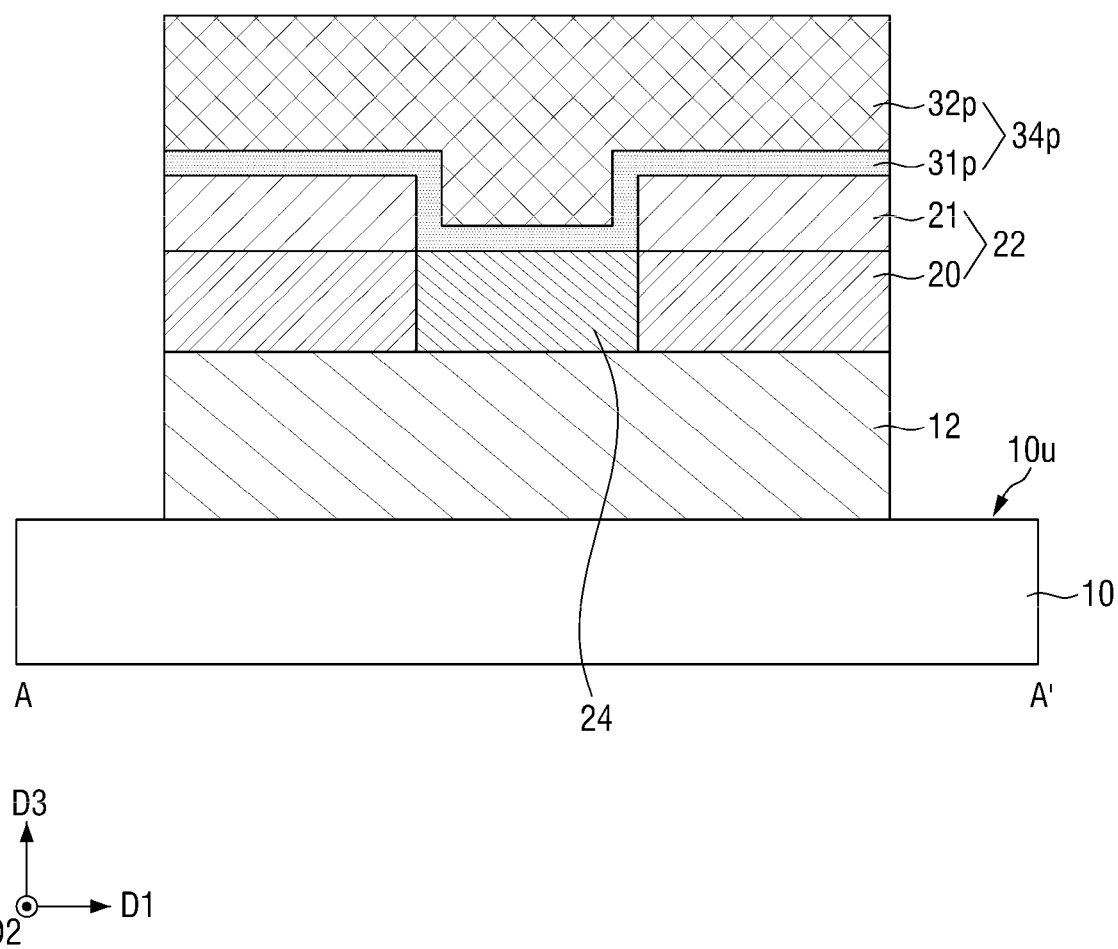
FIGS. 12 and 13 are cross-sectional views illustrating a method of forming an integrated circuit device taken along the line A-A' of FIG. 4.
Figure 13:
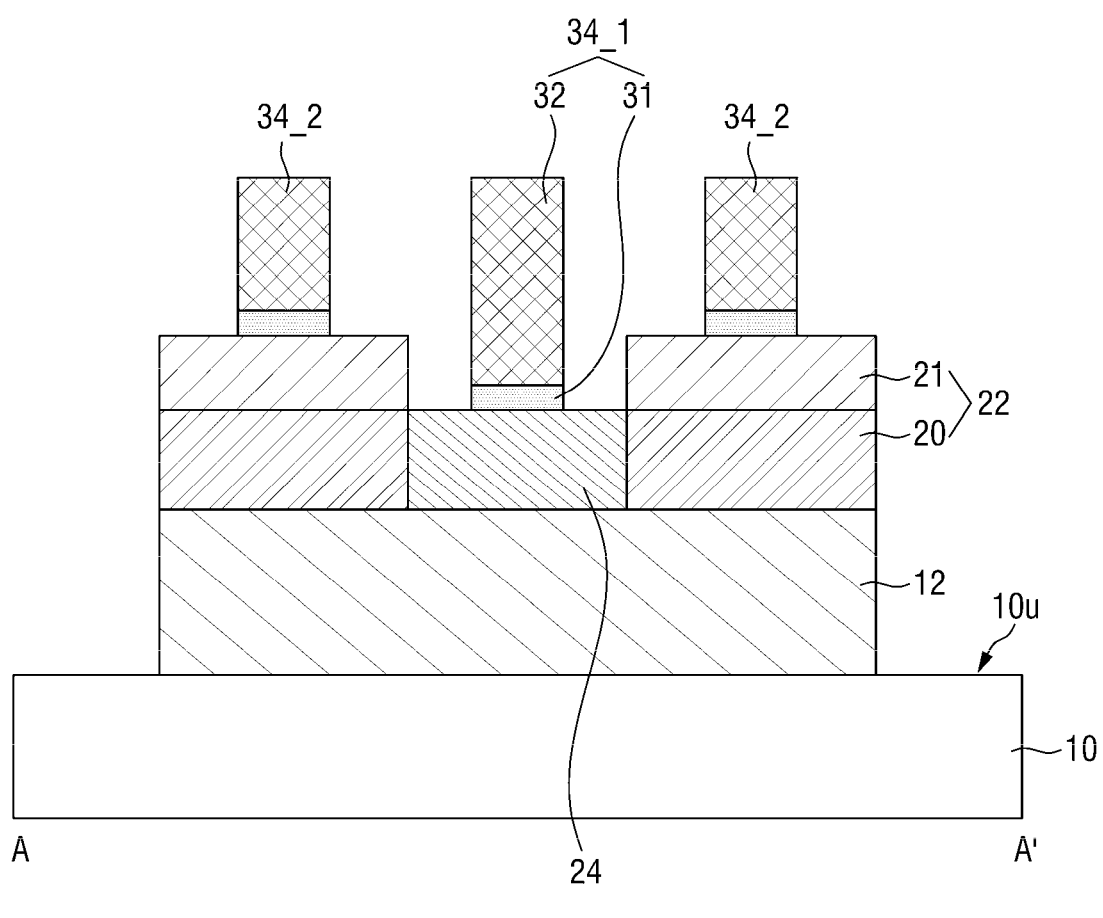
Figure 13:
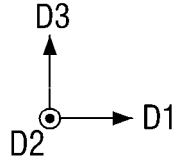

FIG. 11 is a flow chart of a method of forming an integrated circuit device according to some embodiments of the inventive concept, and FIGS. 12 and 13 are cross-sectional views illustrating a method of forming an integrated circuit device taken along the line A-A' of FIG. 4.

Referring to FIGS. 1 and 5 and FIGS. 11 through 13, in some embodiments, forming a second insulating layer and a metallic wire (Block 200 in FIG. 1) may include forming a metallic layer 34p (Block 210 in FIG. 11) as illustrated in FIG. 12, patterning the metallic layer 34p (Block 220 in FIG. 11) as illustrated in FIG. 13, and forming the second insulating layer 30 (Block 230 in FIG. 11) as illustrated in FIG. 5.

In some embodiments, forming the metallic layer 34p may include sequentially forming a preliminary diffusion barrier layer 31p and a preliminary metal layer 32p. The metallic layer 34p may contact an upper surface of the first insulating layer 22 and an upper surface 24u of the via contact 24 and may be formed in a recess (e.g., the recess 26 in FIG. 3) as illustrated in FIG. 12. In some embodiments, forming the preliminary diffusion barrier layer 31p may be omitted, and the preliminary metal layer 32p may contact the upper surface of the first insulating layer 22 and the upper surface 24u of the via contact 24.

In some embodiments, patterning the metallic layer 34p may include sequentially etching the preliminary metal layer 32p and the preliminary diffusion barrier layer 31p until the first insulating layer 22 and the via contact 24 are exposed, thereby forming a first metallic wire 34_1 and second metallic wires 34_2. The first metallic wire 34_1 may contact only a portion of the upper surface 24u of the via contact 24 and may expose a remaining portion of the upper surface 24u of the via contact 24.

In some embodiments, forming the second insulating layer 30 may include forming the second insulating layer 30 between the first metallic wire 34_1 and the first insulating layer 22, and thus the second insulating layer 30 may separate the first metallic wire 34_1 from the first insulating layer 22.

Figure 14:
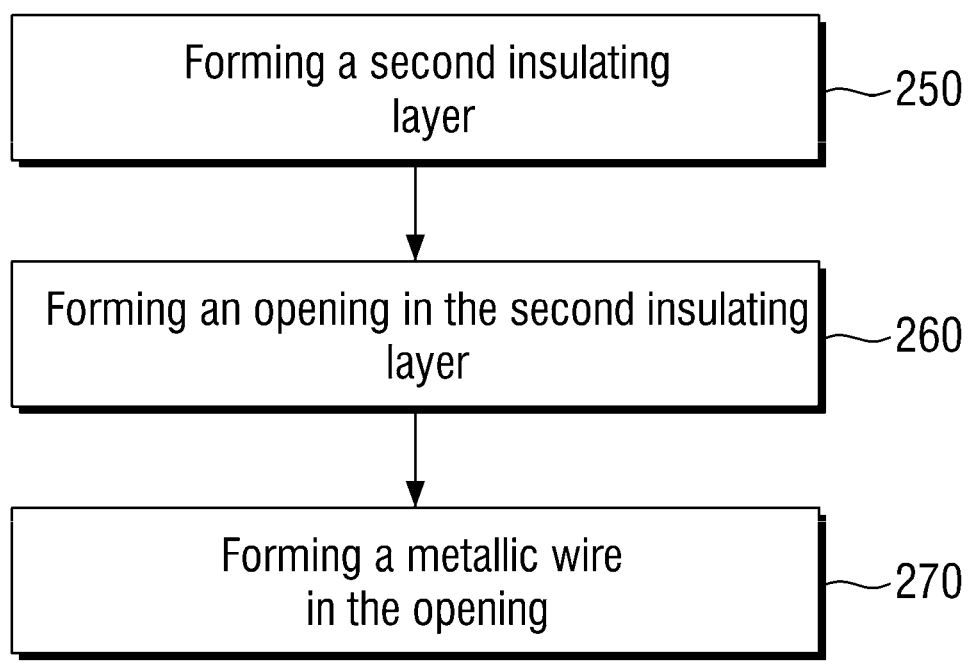
FIG. 14 is a flow chart of a method of forming an integrated circuit device according to some embodiments of the inventive concept.
Figure 15:
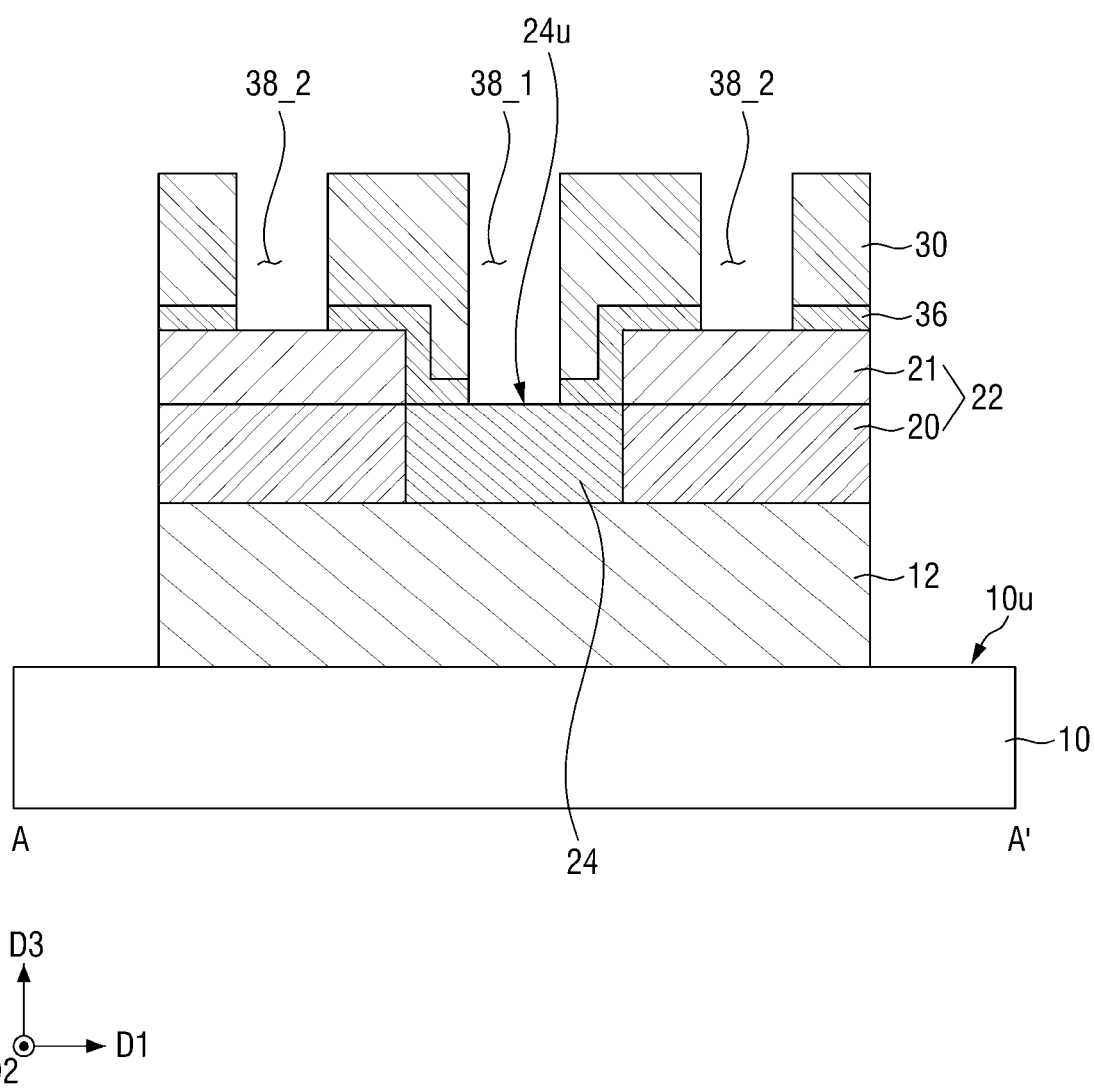
FIG. 15 is a cross-sectional view illustrating a method of forming an integrated circuit device taken along the line A-A' of FIG. 4.

FIG. 14 is a flow chart of a method of forming an integrated circuit device according to some embodiments of the inventive concept, and FIG. 15 is a cross-sectional view illustrating a method of forming an integrated circuit device taken along the line A-A' of FIG. 4.

Referring to FIGS. 1 and 5 and FIGS. 14 and 15, in some embodiments, forming a second insulating layer and a metallic wire (Block 200 in FIG. 1) may include forming the second insulating layer 30 (Block 250 in FIG. 14), forming an opening 38_1 in the second insulating layer 30 (Block 260 in FIG. 14) as illustrated in FIG. 15, and forming a metallic wire 34_1 in the opening 38_1 of the second insulating layer 30 (Block 270 in FIG. 14) as illustrated in FIG. 5.

In some embodiments, an etch stop layer 36 may be formed before forming the second insulating layer 30, and the etch stop layer 36 may be removed while forming the opening 38_1. The etch stop layer 36 may be a single layer or multiple stacked layers. For example, the etch stop layer 36 may be a single layer including SiCN, may be two stacked layers including AlN/Oxygen Doped Carbide (ODC), AlOx/ODC or SiCN/SiC, or may be three stacked layers including AlOx/ODC/AlOx. The ODC includes Si, O, and C. The opening 38_1 may be a first opening exposing a portion of the upper surface 24u of the via contact 24 and second openings 38_2 may be also formed in the second insulating layer 30. The second openings 38_2 may expose the first insulating layer 22.

Referring back to FIG. 5, the first metallic wire 34_1 may be formed in the first opening 38_1, and the second metallic wires 34_2 may be formed in the second openings 38_2, respectively.

Example embodiments are described herein with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein the term "and/or" includes any and all combinations of one or more of the associated listed items.

It should be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming an integrated circuit device, the method comprising:
    forming a first insulating layer and a via contact on a substrate, wherein the substrate comprises an upper surface facing the via contact, and the via contact is in the first insulating layer and comprises a lower surface facing the substrate and an upper surface opposite to the lower surface; and
    forming a second insulating layer and a metallic wire on the via contact, wherein the metallic wire is in the second insulating layer and comprises a lower surface that faces the substrate and contacts the upper surface of the via contact,
    wherein both the lower surface of the metallic wire and an interface between the metallic wire and the via contact have a first width in a first horizontal direction that is parallel to the upper surface of the substrate,
    wherein the upper surface of the via contact has a second width in the first horizontal direction,
    wherein the second width is wider than the first width,
    wherein, in a plan view, the metallic wire extends longitudinally in a second horizontal direction that is perpendicular to the first horizontal direction, and
    wherein the via contact comprises opposing sides that are spaced apart from each other in the first horizontal direction, and the metallic wire does not overlap the opposing sides of the via contact.

2. The method of claim 1, wherein the metallic wire comprises a first metallic wire and a second metallic wire that are spaced apart from each other in the first horizontal direction, wherein the first metallic wire comprises a first lower surface that faces the substrate and contacts the upper surface of the via contact, and the second metallic wire comprises a second lower surface that faces the substrate and contacts the first insulating layer, and wherein the first lower surface of the first metallic wire is spaced apart from the upper surface of the substrate by a first distance, and the second lower surface of the second metallic wire is spaced apart from the upper surface of the substrate by a second distance that is longer than the first distance.

3. The method of claim 2, wherein the first metallic wire comprises a first upper surface opposite to the first lower surface of the first metallic wire, the second metallic wire comprises a second upper surface opposite to the second lower surface of the second metallic wire, and the first upper surface of the first metallic wire and the second upper surface of the second metallic wire are coplanar.

4. The method of claim 1, wherein the first insulating layer comprises an upper surface contacting the second insulating layer, and wherein the upper surface of the via contact is recessed toward the substrate with respect to the upper surface of the first insulating layer.

5. The method of claim 4, wherein the second insulating layer comprises a lower k dielectric material that is different from a material of the first insulating layer.

6. The method of claim 4, wherein opposing sides of the first insulating layer and the upper surface of the via contact define a recess, and wherein the metallic wire comprises a lower portion in the recess, and the lower portion of the metallic wire is spaced apart from the opposing sides of the first insulating layer.

7. The method of claim 4, wherein opposing sides of the first insulating layer and the upper surface of the via contact define a recess, and wherein the metallic wire comprises a lower portion in the recess, and the second insulating layer separates the lower portion of the metallic wire from the opposing sides of the first insulating layer.

8. The method of claim 1, wherein the metallic wire comprises a diffusion barrier layer and a metal layer sequentially stacked on the via contact.

9. The method of claim 1, wherein forming the first insulating layer and the via contact comprises:

forming a preliminary first insulating layer and the via contact on the substrate, wherein the via contact is in the preliminary first insulating layer; and selectively forming a capping insulating layer on the preliminary first insulating layer while not forming the capping insulating layer on the upper surface of the via contact, wherein the first insulating layer comprises the preliminary first insulating layer and the capping insulating layer, and the capping insulating layer and the upper surface of the via contact define a recess.

10. The method of claim 1, wherein forming the second insulating layer and the metallic wire comprises:

forming the second insulating layer on the first insulating layer and the via contact;

forming an opening in the second insulating layer by removing a portion of the second insulating layer, the opening exposing the portion of the upper surface of the via contact; and forming the metallic wire in the opening.

11. A method of forming an integrated circuit device, the method comprising:

forming a first insulating layer and a via contact on a substrate, wherein the substrate comprises an upper surface facing the via contact, and the via contact comprises a lower surface facing the substrate and an upper surface that is opposite to the lower surface and is recessed toward the substrate with respect to the first insulating layer; and forming a second insulating layer and a metallic wire on the via contact, wherein the metallic wire is in the second insulating layer and contacts a portion of the upper surface of the via contact, wherein the via contact comprises opposing sides that are spaced apart from each other in a horizontal direction that is parallel to the upper surface of the substrate, and the metallic wire does not overlap the opposing sides of the via contact, and wherein forming the second insulating layer and the metallic wire comprises:

forming a metallic layer on the first insulating layer and the via contact;

forming the metallic wire by patterning the metallic layer; and forming the second insulating layer on the metallic wire.

12. The method of claim 11, wherein the metallic wire comprises a lower surface facing the substrate, and wherein the lower surface of the metallic wire has a first width in the horizontal direction, the upper surface of the via contact has a second width in the horizontal direction, and the second width is wider than the first width.

13. The method of claim 11, wherein the metallic wire comprises a first metallic wire and a second metallic wire that are spaced apart from each other in the horizontal direction, wherein the first metallic wire comprises a first lower surface contacting the portion of the upper surface of the via contact, and the second metallic wire comprises a second lower surface contacting the upper surface of the first insulating layer, and wherein the first lower surface of the first metallic wire is spaced apart from the upper surface of the substrate by a first distance, and the second lower surface of the second metallic wire is spaced apart from the upper surface of the substrate by a second distance that is longer than the first distance.

14. The method of claim 11, wherein forming the first insulating layer and the via contact comprises:

forming the first insulating layer and a preliminary via contact on the substrate, wherein the preliminary via contact is in the first insulating layer; and forming a recess defined by the first insulating layer and the upper surface of the via contact by removing a portion of the preliminary via contact.

15. The method of claim 11, wherein forming the first insulating layer and the via contact comprises:

forming a preliminary first insulating layer and the via contact on the substrate, wherein the via contact is in the preliminary first insulating layer; and selectively forming a capping insulating layer on the preliminary first insulating layer, wherein the first insulating layer comprises the preliminary first insulating layer and the capping insulating layer, and the capping insulating layer and the upper surface of the via contact define a recess.

16. A method of forming an integrated circuit device, the method comprising:
- forming a first insulating layer and a via contact on a substrate, wherein the via contact is in the first insulating layer, and the substrate comprises an upper surface facing the via contact; and
- forming a first metallic wire and a second metallic wire on the via contact and the first insulating layer, wherein the first metallic wire and the second metallic wire are spaced apart from each other in a horizontal direction that is parallel to the upper surface of the substrate, and wherein the first metallic wire is spaced apart from the upper surface of the substrate by a first distance and contacts the via contact, and the second metallic wire is spaced apart from the upper surface of the substrate by a second distance that is greater than the first distance and contacts the first insulating layer,
- wherein the first metallic wire comprises first opposing sides spaced apart from each other in the horizontal direction, the via contact comprises second opposing sides spaced apart from each other in the horizontal direction, and the first opposing sides are between the second opposing sides.

17. The method of claim 16, wherein forming the first metallic wire and the second metallic wire comprises:
- forming a metallic layer on the first insulating layer and the via contact; and
- forming the first metallic wire and the second metallic wire by patterning the metallic layer, wherein the first metallic wire exposes a portion of the via contact,
- wherein the method further comprises forming a second insulating layer that is between the first metallic wire and the second metallic wire and contacts the portion of the via contact exposed by the first metallic wire.

18. The method of claim 16 further comprising:
- forming a second insulating layer on the first insulating layer and the via contact; and
- forming a first opening and a second opening in the second insulating layer, wherein the first opening exposes a first portion of the via contact, and the second opening exposes a portion of the first insulating layer, wherein the second insulating layer contacts a second portion of the via contact, and wherein the first metallic wire is formed in the first opening and the second metallic wire is formed in the second opening.

\* \* \* \* \*